Figure 1:
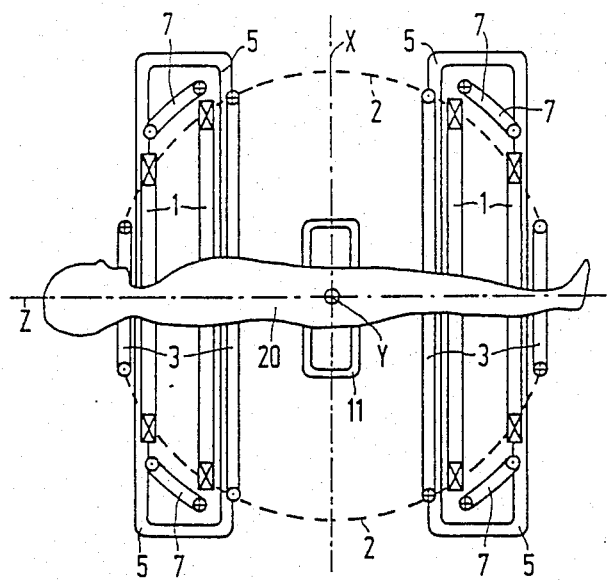

United States Patent [19]

Kuhn et al.

[11] Patent Number: 4,820,984

[45] Date of Patent: Apr. 11, 1989

[54] MR TOMOGRAPHY METHOD AND MR TOMOGRAPHY APPARATUS FOR PERFORMING THE METHOD

[75] Inventors: Michael H. Kuhn, Hamburg; Graeme C. McKinnon, Ellerau, both of Fed. Rep. of Germany

[73] Assignee: U.S. Philips Corporation, New York, N.Y.

[21] Appl. No.: 94,568

[22] Filed: Sep. 9, 1987

[30] Foreign Application Priority Data

Sep. 12, 1986 [DE] Fed. Rep. of Germany ....... 3631039

[51] Int. Cl.⁴ ............................................. G01R 33/20
[52] U.S. Cl. ..................................... 324/309; 324/307
[58] Field of Search ...................... 324/309, 307, 312; 128/653

[56] References Cited

U.S. PATENT DOCUMENTS

| | | |
|---|---|---|
| 4,115,730 | 9/1978 | Mansfield ............................ 324/309 |
| 4,431,968 | 2/1984 | Edelstein ............................. 324/309 |
| 4,558,278 | 12/1985 | Young ................................. 324/309 |
| 4,577,152 | 3/1986 | Macovski ............................ 324/309 |
| 4,654,595 | 3/1987 | Sepponen ........................... 324/309 |
| 4,665,367 | 5/1987 | Kramer et al. ...................... 324/309 |
| 4,673,880 | 6/1987 | Compton et al. ................... 324/309 |
| 4,717,879 | 1/1988 | Riederer et al. .................... 324/309 |

Primary Examiner—Stewart J. Levy
Assistant Examiner—Louis M. Arana

[57] ABSTRACT

The invention relates to a multislice MR tomography method. Because the sequences for the individual slices are not performed successively in time but rather in an interleaved manner, shorter cycle periods and an improved T2 contrast can be obtained.

7 Claims, 2 Drawing Sheets

MR TOMOGRAPHY METHOD AND MR TOMOGRAPHY APPARATUS FOR PERFORMING THE METHOD

The invention relates to an MR tomography method in which a plurality of slices are selectively and successively excited by a respective first rf pulse, after which the nuclear magnetization in the respective slices is rotated through each time 180° in the same sequence as before by further selective rf pulses, after which the spin echo signals from the slices are detected in the presence of a magnetic gradient field, and also relates to an MR tomography apparatus for performing the method.

Multislice methods of this kind are known from U.S. Pat. No. 4,577,152. Therein, a plurality of neighbouring slices are excited in time-interleaved sequences so that the excitation of the last one of these slices has taken place before the first spin echo signal appears. As a result, very short measurement periods per slice can be achieved, even when the distance between the first rf ulse exciting a slice and the spin echo signal from the relevant slice is comparatively large.

In accordance with the known method, during the spin echo signals there is applied a magnetic gradient field which ensures that the nuclear magnetization in the excited slices is dephased so that notably the last spin echo signals can hardly be detected.

From DE-OS No. 33 45 209 and Japanese Kokai No. 59-40152 there are known further multislice methods where a plurality of slices are successively excited before formation of the first echo signal. The drawback of these methods consists in that first the echo signal from the last slice excited appears while the echo signal of the slice first excited appears last. The distance between excitation and echo signal thus varies from one slice to another, so that the slice images formed by means of these signals exhibit different T2 contrasts.

It is the object of the invention to provide an MR tomography method and an MR tomography apparatus for performing this method in which the echo signals from the slices appear in the same sequence as used for the excitation of the slices on the one hand and the echo signals are not dephased on the other hand.

Utilizing a method of the kind set forth, this object is achieved in accordance with the invention in that the magnetic gradient field is switched on and off before and between the further rf pulses with such a gradient and for such a duration that the time integral over the magnetic gradient field until the appearance of the further rf pulse selectively exciting one of the slices has the same value as the subsequent time integral over the magnetic gradient field until the appearance of the spin echo signal in the relevant slice.

Because the magnetic gradient field is switched on not only when the spin echo signals appear but also before and between the further rf pulses, it can always be ensured, utilizing a suitably proportioned gradient or duration of application of the gradient field, that the time integral over the magnetic gradient field upon appearance of the spin echo signal in a slice has exactly the value zero for the relevant slice, so that the gradient condition is satisfied and the 5 pin echo signal appears with the highest possible amplitude.

The invention utilizes the fact that a magnetic gradient field applied before the 180° rf pulse during a spin echo sequence has the opposite effect on the spin echo signal in comparison with the magnetic gradient field applied after the 180° rf pulse. The application of the magnetic gradient field between the further rf pulses thus has an opposite effect on the slices which have already been exposed to an 180° rf pulse in comparison with the slices which have not been exposed thereto. Thus, the gradient condition is satisfied at a different instant for each slice, that is to say at the instant at which the spin echo signal also appears.

It is to be noted that whenever the appearance of a signal or a pulse is mentioned herein, or the distance in time between signals and pulses, always the centre of these signals or pulses is intended. In an elaboration of the invention, the rf pulses which excite the nuclear magnetization in each time the same slice are separated by at least approximately the same distance in time as the corresponding pulses of the other slices. It is thus achieved that the images of the various slices formed by means of these signals have the same T2 contrast.

In a further elaboration of the invention, after the last one of the first rf pulses and before the first one of the further rf pulses there is applied a magnetic gradient field which has an amplitude and/or duration which varies from one cycle to another, its gradient extending each time perpendicularly to the gradient of the magnetic gradient field generated during the echo signals. As a result, for all excited slices phase encoding is achieved by the once-only activation of a magnetic gradient field.

In a further elaboration of the invention, the first rf pulses rotate the nuclear magnetization in the respective excited slice through an angle of less than 90°. As a result, very short measurement periods can be achieved.

An MR tomography apparatus for performing the method which comprises a magnet for generating a uniform, steady magnetic field, an rf coil system for generating an rf magnetic field which extends perpendicularly with respect to the steady magnetic field, several gradient coil systems for generating magnetic fields which extend in the direction of the steady magnetic field and which have gradients which extend in different directions, an rf generator for supplying the rf coil system with rf pulses having a presettable carrier frequency, generators for powering the gradient coil systems, and a control unit for controlling the rf generator and the generators for the gradient coil systems is characterized in that the control unit is programmed so that several first rf pulses of different frequency are generated and subsequently further rf pulses whose frequency varies from one pulse to another in the same way as that of the first pulses, one of the generators being switched on and off before, between and after the further rf pulses.

Figure 3:
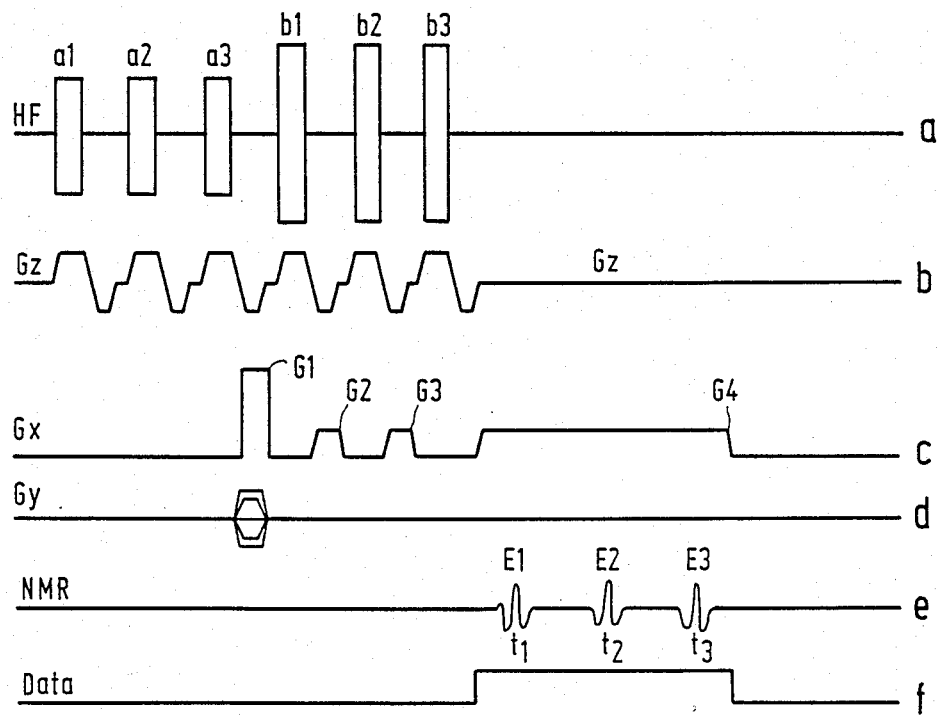
Figure 2:
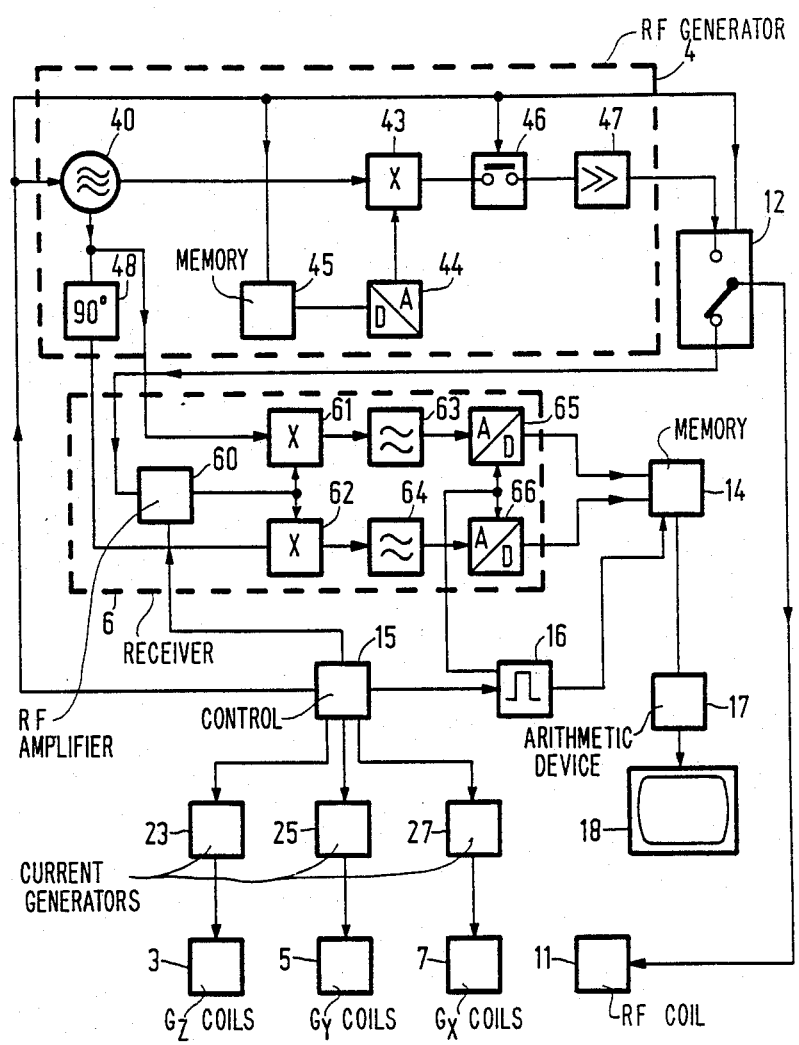

The invention will be described in detail hereinafter with reference to the drawing. Therein:

FIG. 1 shows an MR tomography apparatus for performing the method in accordance with the invention, FIG. 2 shows a block diagram of such an apparatus, and FIG. 3 shows the variation in time of various signals during execution of the method in accordance with the invention.

The MR tomography apparatus which is diagrammatically shown in FIG. 1 comprises a system for generating a steady, uniform magnetic field which consists of four coils 1. This field extends in the z-direction of a cartesian xyz coordinate system. The coils 1 are concentrically situated with respect to the z-axis and may be arranged on a spherical surface 2. The patient 20 to be examined is situated within these coils.

In order to generate a magnetic field Gz which extends in the z-direction and which linearly varies in this direction there are provided four coils 3 which are preferably arranged on the same spherical surface. There are also provided four coils 7 which generate a magnetic gradient field Gx (i.e. a magnetic field whose strength varies linearly in one direction) which also extends in the z-direction but whose gradient extends in the x-direction. A magnetic gradient field Gy which extends in the z-direction and which has a gradient in the y-direction is generated by four coils 5 which may have the same construction as the coils 7 but which are arranged so as to be rotated through 90° with respect thereto. Only two of these four coils are shown in FIG. 1. Because each of the three coils systems 3, 5 and 7 for generating the magnetic gradient fields Gz, Gy and Gx is symmetrically arranged with respect to the spherical surface 2, the field strength in the centre of the sphere, being at the same time the origin of the cartesian coordinate system, will be determined only by the steady, uniform magnetic field of the coil system 1.

There is also provided an rf coil 11 which is symmetrically arranged with respect to the plane z=0 of the coordinate system and which is constructed so that it generates an rf magnetic field which is substantially uniform and which extends in the x-direction, i.e. perpendicularly with respect to the direction of the steady, uniform magnetic field. The rf coil receives an rf modulated current from an rf generator during each rf pulse. Subsequent to each rf pulse, the rf coil 11 serves for receiving spin resonance signals generated in the examination zone. However, a separate rf receiving coil may also be used instead.

FIG. 2 shows a simplified block diagram of the above MR tomography apparatus. Via a switching device 12, the rf coil 11 is connected on the one side to an rf generator 4 and on the other side to an rf receiver 6.

The rf generator 4 comprises an rf oscillator 40 whose frequency can be digitally controlled and which generates oscillations with a frequency which is equal to the Larmor frequency of the nuclei to be excited at the field strength generated by the coils 1. As is known, the Larmor frequency f can be calculated in accordance with the relation $f = cB$, where B is the magnetic induction in the steady, uniform magnetic field and c is the gyromagnetic ratio; for example, for protons this ratio amounts to 42.56 MHz/T. The output of the oscillator 40 is connected to an input of a mixing stage 43. The mixing stage 43 receives a second input signal from a digital-to-analog converter 44 whose output is connected to a digital memory 45. A series of digital data words which represent an envelope signal is read from the memory under the control of a control device 15.

The mixing stage 43 processes the input signals applied thereto so that the carrier oscillation modulated with the envelope signal appears on its output. The output signal of the mixing stage 43 is applied, via a switch 46 which is controlled by the control device 15, to an rf power amplifier 47 whose output is connected to the switching device 12. The latter device is also controlled by the control device 15.

The receiver 6 comprises an rf amplifier 60 which is connected to the switching device and which receives the echo signal induced in the rf coil 11; the switching device must then be in the appropriate switching position. The amplifier 60 comprises a muting input which is controlled by the control device 15 and via which it can be blocked so that its gain is substantially zero. The output of the amplifier is connected to the first inputs of two multiplying mixing stages 61 and 62, each of which supplies an output signal which corresponds to the product of their input signals. The second inputs of the mixing stages 61 and 62 receive a signal having the frequency of the oscillator 40, there being a phase difference of 90° between the signals on the two inputs. This phase shift is created by means of a 90° phase shifter 48 whose output is connected to the input of the mixing stage 62 and whose input is connected to the input of the mixing stage 61 and to the output of the oscillator 40.

The output signals of the mixing stages 61 and 62 are applied, via low-pass filters 63 and 64 which suppress the frequency supplied by the oscillator 40 as well as all higher frequencies and which conduct lower frequency components, to a respective analog-to-digital converter 65, 66. These converters convert the analog signals of the circuit 61 . . . 64, forming a quadrature demodulator, into digital data words which are applied to a memory 14. The analog-to-digital converters 65 and 66 as well as the memory receive their clock pulses from a clock pulse generator 16 which can be blocked and released by the control device 15, via a control lead, so that the signals supplied by the rf coil 11 and transposed to the low frequency range can be converted into a series of digital data words for storage in the memory 14 only during a measurement interval which is defined by the control device 15.

The data words or sampling values stored in the memory 14 are applied to an arithmetic device 17 which determines therefrom the spatial distribution of the nuclear magnetization in a slice of the examination zone and which outputs the distribution thus determined to a suitable display apparatus, for example a monitor 18. Current generators 23, 25 and 27 supply the three coil systems 3, 5 and 7 with a current from whose variation in time can be controlled by means of the control unit 15.

FIG. 3 shows the variation in time of different signals during a cycle of the method in accordance with the invention. In each cycle a number of first rf pulses which corresponds to the number of slices to be imaged is formed: three rf pulses a1 . . . a3 in accordance with FIG. 3a. The current generator 23 is then controlled by the control unit 15 so that the magnetic gradient coils 3 generate a magnetic gradient field Gz during each of these pulses, the direction of the gradient of said gradient field being rotated through 180° after each rf pulse, after which it reaches the value zero again so that at that instant the integral over the magnetic gradient field has exactly the value zero as from the centre of an rf pulse (see FIG. 3b).

The frequency of the oscillator 40, and hence the mean value in time of the frequency of the oscillations of the rf magnetic field contained in an rf pulse is varied from one rf pulse to another by the control unit 15. As a result, the three rf pulses successively excite the nuclear magnetization in three mutually offset slices which are perpendicular to the z-axis.

The last one of these three first rf pulse is followed by three further rf pulses b1, b2 and b3 which rotate the nuclear magnetization each time through 180° in the excited slice. For the rf pulse b1 the frequency of the oscillator 40 has the same value as for the rf pulse a1. For the rf pulse b2, being situated at the same distance in time from a2 as b1 is situated from a1, the frequency of the oscillator 40 corresponds to the frequency for the rf pulse a2. Finally, for the rf pulse b3 which is situated at the same distance in time from a3 as a1 is situated from b1, the frequency has the same value as for the rf pulse a3. During each of the three further rf pulses the magnetic gradient field Gz is switched on and off in the same way as for the rf pulses a1 . . . a3, so that the rf pulses b1 . . . b3 rotate the nuclear magnetizations in the three previously excited slices through each time 180°.

Each of the slices is thus excited by a first rf pulse in conjunction with a 180° rf pulse, thus forming a spin echo signal in the relevant slice. The spin echo signals E1, E2 and E3 (see FIG. 3e) formed in the three slices occur at the instants t1, t2 and t3 which are situated at the same distance from the further rf pulses b1, b2 and b3, respectively, as these pulses are situated from the first rf pulses a1, a2 and a3, respectively.

The last rf pulse a3 is followed by a preparation of encoding phase. during this time interval the control unit 15 controls the current generator 25 so that the gradient coil system 5 generates a magnetic gradient field Gy whose gradient varies from one cycle to another (see FIG. 3d).

In order to generate a magnetic gradient field Gx, the control unit 15 switches on the current generator 27 between the last one (a3) of the three first rf pulses and the first one of the further rf pulses (b1) (G1, see FIG. 3c), between the rf pulses b1 . . . b3 (G2 and G3), as well as after the three rf pulses (G4), each time with the same polarity of the gradient. Between the further rf pulses the gradient G2, G3 of the magnetic gradient field has the same value as upon appearance of the spin echo signals (G4). The period during which the magnetic gradient field is switched on between the further rf pulses amounts to half the distance in time between two rf pulses (for example, between a1 and a2).

The gradient G1 of the magnetic gradient field Gx before the further pulses is three times larger than between the further rf pulses. The duration of the activation of the magnetic gradient field is the same as between the rf pulses. The magnetic gradient field G4 subsequent to the three further rf pulses is activated a period of time before the occurrence of the first echo signal E1 which corresponds to half the distance in time between the rf pulses a1 and a2 and is deactivated a corresponding period of time after the occurrence of the third spin echo signal.

The effect of the described variation in time of the magnetic gradient field Gx on the spin echo signals in the individual slices will be described in detail hereinafter.

For the first slice G2 and G3 cause the opposed phase shift in comparison with G1, because the 180° rf pulse b1 for this slice is generated between G1 and G2. The time integral over G2, G3 and G4 has the same value as G1 at the instant t1. Therefore, the phase condition for the first slice is satisfied when the spin echo signal of this slice occurs.

For the second slice the magnetic gradient field G2 has the same effect on the phase shift as the magnetic gradient field G1 and the opposite effect with respect to the magnetic gradient field G3 and G4 because the 180° rf pulse for this slice is active between G2 and G3. The time integral over G1 and G2 corresponds to the time integral over G3 and G4 until the instant T2, i.e. the phase condition for the second slice is satisfied at the instant T2 at which the spin echo signal for this slice occurs.

Analogously, for the third slice the magnetic gradient fields G1, G2 and G3 act in the same sense and oppositely with respect to the magnetic gradient field G4, so that the gradient condition for the third slice is satisfied at the instant t3 at which the spin echo signal E3 of this slice occurs.

Thus, for each slice the gradient condition is satisfied exactly when the spin echo signal E1 . . . E3 of this slice occurs.

As appears from FIG. 3f, the clock pulse generator 16 is enabled during the appearance of the spin echo signals E1...E3. Therefore, these signals can be converted into digital values which are loaded into the memory 14 or processed in the arithmetic device 17.

When the method in accordance with the invention is used for n slices instead of for three slices, the grdient G1 must be n times larger then G2 or G3.

G1, G2 and G3 need not always be activated for the same period of time. It is only important the time integral over G1 is three times or n times larger than the time integral over G2 or G3 and that the time integral over G4 between two spin echo signals (for example during the interval t1-t2) is twice as large as the time integral over G2 or G3.

It will be apparent that the same effect will be obtained when G1 is increased and when G4 is activated proportionally sooner.

In principle it would be sufficient for the magnetic gradient field G4 to be activated at the instant t1 and deactivated at the instant t3, so that only the second half of E1 and the first half of E3 could be detected. In that case the time integral over G1 should only be twice as large (generally n-1 times) as the time integral over G2 or G3.

After the last spin echo signal has been received, the next cycle may be started etc. only the time integral over Gy being varied from one cycle to another. If the beginning of the next cycle were to be postponed until the longitudinal magnetization in the excited slices would have been completely restored (i.e. a waiting period of at least a few 100 ms), no substantial gain would be made as regards the speed of imaging.

Therefore, the next cycle (again with a number of rf pulses a1 . . . a3 and b1 . . . b3 which corresponds to the number of slices) commences only a short period of time after the detection of the last echo signal. In that case the nuclear magnetization in the examination zone which extends in the z-direction before the first cycle has not yet been completely restored. Therefore, the echo signals during the second cycle would be smaller and would become smaller and smaller from one cycle to another. After approximately from 20 to 30 cycles, however, a steady state is reached after which the amplitude no longer decreases.

Therefore, for the reconstruction use is made only of those echo signals which are obtained after this steady state has been reached, so that no falsifications occur. The signal-to-noise ratio then depends on the flip angle (i.e. the angle through which the nuclear magnetization in the excited slice is rotated by one of the rf pulses a1 . . . a3) of the rf pulse. The most favourable signal-to-noise ratio is obtained when the following holds good for the flip angle a of each rf pulse: $a = \arccos(\exp(-tr/T1))$, where T1 is the longitudinal relaxation time and tr is the period duration of a sequence. However, generally optimum contrast is obtained only for larger flip angles. Therefore, usually a larger flip angle is used than appears from the above formula, be it that said angle is smaller than 90°.

When the duration of a cycle is thus reduced, images of different slices can be formed within a few seconds. The resolution and partly also the contrast of these images is limited, but the image quality will be satisfactory at least for a general survey of a plurality of slices. The decribed method is, therefore, attractively used for obtaining a general view for the benefit of a subsequent method offering a higher image quality (and being substantially more time, consuming).

The invention has been described with reference to a two-dimensional Fourier method. However, it can also be used for other encoding methods, for example the back projection method. The phase encoding by Gy is then omitted and the magnetic gradient field then extends proportionally with respect to the magnetic gradient field Gx in FIG. 3c. From one cycle to another merely the amplitude of the magnetic gradient fields is then varied so that the sum of the squares of the gradients is the same for all cycles.

What is claimed is:

1. An MR tomography method for producing images of a plurality of slices of an object comprising:
    supplying a steady, uniform magnetic field in a first direction in an object imaging zone,
    supplying a sequence of first r-f pulses spaced apart in time for selectively and successively exciting each of said slices of said plurality by a respective first r-f pulse,
    thereafter supplying a sequence of second r-f pulses spaced apart in time by which the nuclear magnetization in the respective slices is rotated through 180° in the same sequence as occurred in response to said first pulses,
    supplying a switchable magnetic gradient field in which the gradient is perpendicular to said first direction, said magnetic gradient field being switched on and off during intervals occurring before the first and between each two of said second r-f pulses, and
    thereafter switching said magnetic gradient field on during a detection interval and detecting spin echo signals from each of said slices,
    said magnetic gradient field having amplitude and duration characteristics such that, with respect to each said slice, the time integral of said magnetic gradient field between first and second r-f pulses for said slice is substantially equal to the subsequent time integral of said magnetic gradient field between said second r-f pulse and the appearance of the spin echo signal corresponding to that slice.

2. An MR tomography method as claimed in claim 1 wherein:
    the time spacing between ones of said first and second r-f pulses that excite the same ones of said slices is substantially the same for each of said slices.

3. An MR tomography method as claimed in claim 1 or 2 wherein:
    the time integral of said magnetic gradient field between any two of sid second r-f pulses is equal to substantially one-half the integral of said gradient field between the corresponding two echo signals.

4. An MR tomography method as claimed in claim 1 or 2 wherein:
    the time integral of said magnetic gradient field before the first pulse of said second sequence being at least n-1 times larger than the time integral of said gradient field between two subsequent ones of said second r-f pulses in a sequence, n being the number of excited slices.

5. An MR tomography method as claimed in claim 1 or 2 wherein:
    between the occurrence of the last one of said first r-f pulses in a sequence and the first one of said second r-f pulses in a sequence, a further magnetic gradient field is supplied, said further magnetic gradient field having a gradient which is perpendicular to that of said switchable magnetic gradient field and an amplitude and/or duration which varies from one cycle to another.

6. An MR tomography method as claimed in claim 1 or 2 wherein:
    said first r-f pulses rotate the nuclear magnetization in the respective excited slice through an angle of less than 90°.

7. An MR tomography apparatus comprising:
    a magnet for generating a uniform steady magnetic field;
    an r-f coil system for generating an r-f magnetic field which extends perpendicular to said steady magnetic field;
    a plurality of gradient coil systems for generating magnetic fields which extend in the direction of said steady magnetic field and which have gradients which extend in different directions;
    an r-f generator for supplying said r-f coil system with r-f pulses having a presettable carrier frequency;
    generators for supplying energizing signals to said gradient coil systems; and
    control unit means for controlling said r-f generator and said generators for said gradient coil systems, said control unit means providing control signals to said r-f generator for supplying a sequence of first r-f pulses of different frequency spaced apart in time, and thereafter supplying a sequence of second r-f pulses spaced apart in time and having frequencies which vary from pulse to pulse in the same manner as said first r-f pulses and said control unit means further providing control signals to at least one of said gradient coil system generators for switching said one gradient coil generator on and off during intervals occurring before the first and between each two of said second r-f pulses and thereafter switching sid magnetic gradient field on during a detection interval to permit detection of spin echo signals relating to slices of a subject under investigation, said magnetic gradient field having amplitude and duration characteristics such that, with respect to each said slice, the time integral of said magnetic gradient field between first and second r-f pulses for said slice is substantially equal to the subsequent time integral of said magnetic gradient field between said second r-f pulse and the appearance of the spin echo signal corresponding to that slice.

* * * * *